US008932042B2

(12) United States Patent
Vermeulen et al.

(10) Patent No.: US 8,932,042 B2
(45) Date of Patent: Jan. 13, 2015

(54) LITHOGRAPHIC APPARATUS AND DEVICE MANUFACTURING METHOD

(75) Inventors: Johannes Petrus Martinus Bernardus Vermeulen, Helmond (NL); Antonius Franciscus Johannes De Groot, Someren (NL); Theodorus Petrus Maria Cadee, Vlierden (NL); Jeroen De Boeij, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 99 days.

(21) Appl. No.: 13/296,571

(22) Filed: Nov. 15, 2011

(65) Prior Publication Data

US 2012/0153543 A1    Jun. 21, 2012

Related U.S. Application Data

(60) Provisional application No. 61/425,405, filed on Dec. 21, 2010.

(51) Int. Cl.
*B29C 67/00* (2006.01)
*B23K 26/36* (2014.01)
*G03F 7/20* (2006.01)

(52) U.S. Cl.
CPC ........ *G03F 7/70758* (2013.01); *G03F 7/70691* (2013.01)
USPC ........ 425/174.4; 425/150; 425/383; 425/385; 264/40.1; 264/40.5

(58) Field of Classification Search
USPC ............. 264/40.1, 40.5, 405; 425/174.4, 150, 425/405.1, 383, 385
See application file for complete search history.

(56) References Cited

U.S. PATENT DOCUMENTS 6,262,796 B1    7/2001    Loopstra et al.
6,441,514 B1 *  8/2002    Markle ...................... 310/12.06
(Continued)

FOREIGN PATENT DOCUMENTS

EP    0 977 244 A2    2/2000
JP    07-285044 A    10/1995
(Continued)

OTHER PUBLICATIONS

English-Language Abstract for Japanese Patent Publication No. 2006-287122 A, published Oct. 19, 2006; 1 page.
(Continued)

*Primary Examiner* — Joseph S Del Sole
*Assistant Examiner* — Nahida Sultana
(74) *Attorney, Agent, or Firm* — Sterne, Kessler, Goldstein & Fox P.L.L.C.

(57) ABSTRACT

A lithography apparatus comprises a projection system arranged to transfer a pattern from a patterning device onto a substrate, a carrier, and a drive system for moving the carrier relative to the projection system in a plane defined by reference to orthogonal axes X and Y. The drive system comprises a shuttle moving parallel to the Y-axis, a shuttle connector connecting the shuttle to the carrier, the shuttle connector allowing movement of the carrier in a direction parallel to the X-axis relative to the shuttle, and a shuttle driver driving movement of the shuttle parallel to the Y-axis. The shuttle is located to one side of the carrier in a direction parallel to the X-axis and it is desirable if only one of the shuttle is connected to the carrier.

21 Claims, 9 Drawing Sheets

(56) References Cited

U.S. PATENT DOCUMENTS

| | | |
|---|---|---|
| 6,510,755 B1 | 1/2003 | Higuchi et al. |
| 7,348,752 B1* | 3/2008 | Butler .................. 318/649 |
| 7,528,931 B2 | 5/2009 | Modderman |
| 7,589,822 B2 | 9/2009 | Shibazaki |
| 7,832,416 B2* | 11/2010 | Wang et al. .................. 134/61 |
| 2002/0196421 A1 | 12/2002 | Tanaka et al. |
| 2003/0155820 A1* | 8/2003 | Tominaga et al. .............. 310/12 |
| 2005/0036877 A1 | 2/2005 | Ogawa et al. |
| 2006/0066832 A1 | 3/2006 | Hoogkamp et al. |
| 2006/0158650 A1 | 7/2006 | Akutsu et al. |
| 2007/0095465 A1* | 5/2007 | Katschorek et al. ....... 156/272.2 |
| 2007/0211613 A1 | 9/2007 | Murayama |
| 2009/0208885 A1 | 8/2009 | Kiuchi |
| 2010/0208227 A1* | 8/2010 | Zhu et al. .................. 355/72 |
| 2011/0018158 A1* | 1/2011 | Menard .................. 264/101 |
| 2012/0099095 A1 | 4/2012 | Zhu et al. |
| 2012/0286450 A1* | 11/2012 | Goto et al. .................. 264/293 |
| 2012/0328725 A1* | 12/2012 | Minoda et al. ................. 425/150 |
| 2013/0015598 A1* | 1/2013 | Kimura .................. 264/40.1 |
| 2013/0056904 A1* | 3/2013 | Hamaya et al. .............. 264/293 |
| 2013/0134630 A1* | 5/2013 | Miyata .................. 264/293 |
| 2013/0241096 A1* | 9/2013 | Shudo et al. .................. 264/40.5 |
| 2013/0300031 A1* | 11/2013 | Torii et al. .................. 264/293 |
| 2014/0054823 A1* | 2/2014 | Torii et al. .................. 264/293 |

FOREIGN PATENT DOCUMENTS

| | | |
|---|---|---|
| JP | 11-274273 A | 10/1999 |
| JP | 2001-091681 A | 4/2001 |
| JP | 2006-179906 A | 7/2006 |
| JP | 2006-287122 A | 10/2006 |
| JP | 2007-306034 A | 11/2007 |
| JP | 2010-098332 A | 4/2010 |
| WO | WO 97/30819 A1 | 8/1997 |
| WO | WO 2010/111973 A1 | 10/2010 |

OTHER PUBLICATIONS

English-Language Abstract for Japanese Patent Publication No. 07-285044 A, published Oct. 31, 1995; 1 page.

English-Language Abstract for Japanese Patent Publication No. 11-274273 A, publised Oct. 8, 1999; 1 page.

English-Language Abstract for Japanese Patent Publication No. 2007-306034 A, published Nov. 22, 2007; 1 page.

\* cited by examiner

LITHOGRAPHIC APPARATUS AND DEVICE MANUFACTURING METHOD

CROSS REFERENCE TO RELATED APPLICATIONS

This application claims the benefit under 35 U.S.C. §119(e) to U.S. Provisional Patent Application No. 61/425,405, filed Dec. 21, 2010, which is incorporated by reference herein in its entirety.

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a measurement phase, during which the substrate surface is characterized, and an exposure phase, during which the desired pattern is imaged onto the substrate by the patterned radiation beam, the substrate is supported on a substrate table that is movable relative to the projection system. A drive mechanism is provided for driving the movement of the substrate table.

In order to minimize the distance traveled by the substrate table when switching between the measurement phase and the exposure phase, and when unloading and loading a substrate to/from the substrate table, it has been found convenient in prior art systems to use so-called planar motors to drive movement of the substrate table. These planar motors are implemented by attaching coils to the substrate table and permanent magnets to a body beneath the substrate table. The coils are driven in such a way as to cause the required accelerations and decelerations associated with the intended movement of the substrate table. The coils and permanent magnets car also be configured to cause levitation of the substrate table above the permanent magnets.

The planar motor configuration provides for movement that is relatively unconstrained spatially, and any connections between the substrate table and other parts of the lithography apparatus can stay constant during transfer of the substrate table from the measurement phase to the exposure phase; there is no need for the substrate table to be transfer-red from one drive mechanism to another drive mechanism, for example.

A problem with the use of such planar motors is that they are relatively inefficient, requiring a large amount of power to achieve the movement required. This increases cost and may limit the extent to which such systems can be used for processing larger substrates (which will require larger substrate tables and therefore larger forces) and/or increasing throughput (which will require larger accelerations and therefore larger forces).

SUMMARY

It is desirable to provide a more efficient way of driving movement of the substrate table.

According to an aspect of the present invention, there is provided a lithography apparatus comprising a projection system arranged to transfer a pattern from a patterning device onto a substrate, a carrier, and a drive system for moving the carrier relative to the projection system in a plane defined by reference to orthogonal axes X and Y. The drive system comprises a shuttle constructed and arranged to move parallel to the Y-axis, a shuttle connector for connecting the shuttle to the carrier, the shuttle connector being such as to allow movement of the carrier in a direction parallel to the X-axis relative to the shuttle, and a shuttle driver for driving movement of the shuttle parallel to the Y-axis. The shuttle is located to one side only of the carrier in a direction parallel to the X-axis and only one of the shuttle is connected to the carrier, and the shuttle driver and shuttle connector are configured to supply at least 10% of the Y-component of forces applied to the carrier by the drive system.

According to an alternative aspect of the present invention, there is provided a lithography apparatus comprising a projection system arranged to transfer a pattern from a patterning device onto a substrate, a carrier, and a drive system for moving the carrier relative to the projection system in a plane defined by reference to orthogonal axes X and Y. The drive system comprises a shuttle constructed and arranged to move parallel to the Y-axis, a shuttle connector for connecting the shuttle to the carrier, the shuttle connector being such as to allow movement of the carrier in a direction parallel to the X-axis relative to the shuttle, and a shuttle connector driver for driving movement of the shuttle parallel to the X-axis via the shuttle connector. The shuttle is located to one side only of the carrier in a direction parallel to the X-axis and only one of the shuttle is connected to the carrier.

According to another alternative aspect of the present invention, there is provided a device manufacturing method comprising transferring a pattern onto a substrate, comprising using a drive system to move a carrier relative to the projection system in a plane defined by reference to orthogonal axes X and Y. The drive system comprises a shuttle constructed and arranged to move parallel to the Y-axis, a shuttle connector for connecting the shuttle to the carrier, the shuttle connector being such as to allow movement of the carrier in a direction parallel to the X-axis relative to the shuttle, and a shuttle driver for driving movement of the shuttle parallel to the Y-axis. The shuttle is located to one side only of the carrier in a direction parallel to the X-axis and only one of the shuttle is connected to the carrier, and the shuttle driver and shuttle connector are configured to supply at least 10% of the Y-component of forces applied to the carrier by the drive system.

According to a still further alternative aspect of the present invention, there is provided a device manufacturing method comprising transferring a pattern onto a substrate, comprising using a drive system to move a carrier relative to the projection system in a plane defined by reference to orthogonal axes X and Y. The drive system comprises a shuttle constructed and arranged to move parallel to the Y-axis, a shuttle connector for connecting the shuttle to the carrier, the shuttle connector being such as to allow movement of the carrier in a direction parallel to the X-axis relative to the shuttle, and a shuttle connector driver for driving movement of the shuttle parallel to the X-axis via the shuttle connector. The shuttle is located to one side only of the carrier in a direction parallel to the X-axis and only one of the shuttle is connected to the carrier.

Further features and advantages of the present invention, as well as the stricture and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
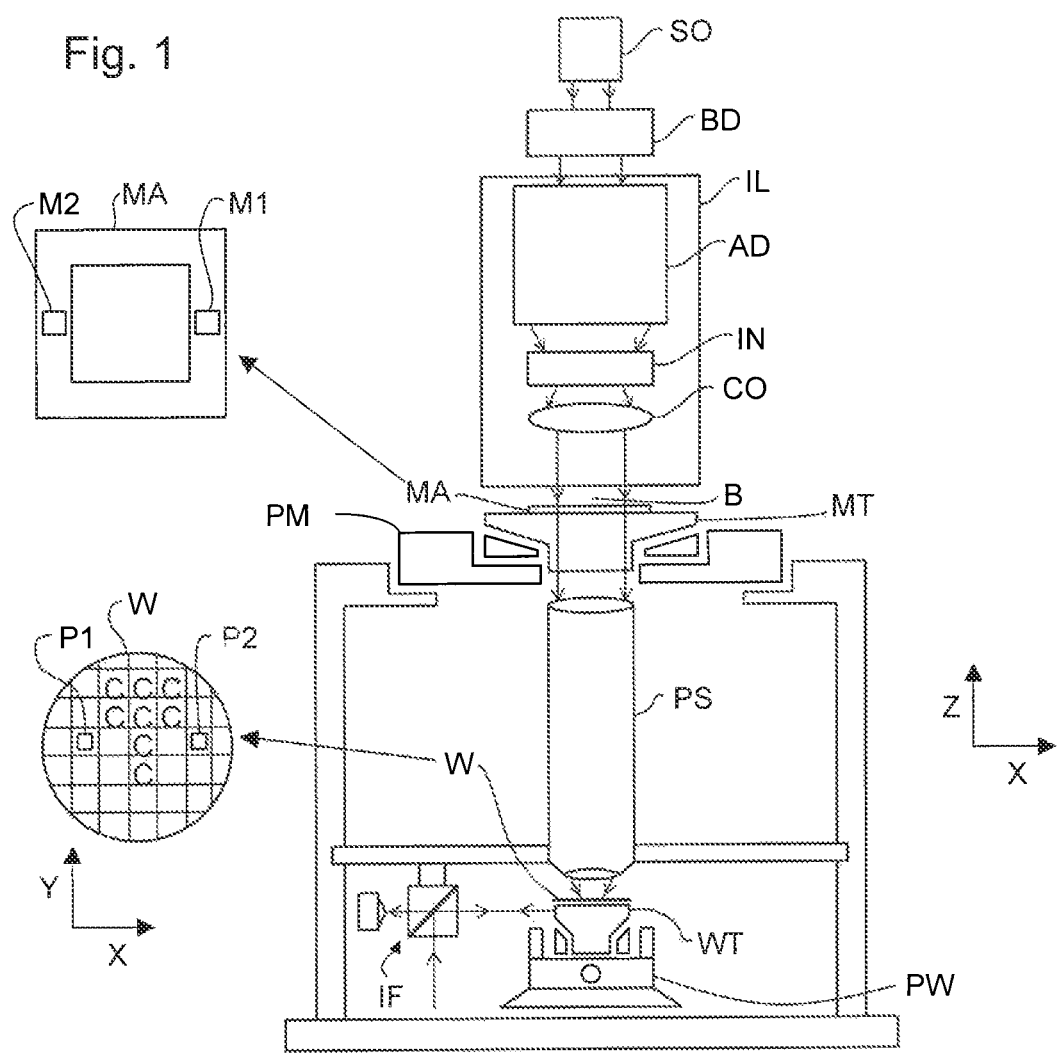
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented FIG. 1 schematically depicts a lithographic apparatus according to one embodiment of the present invention. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, during exposure of the substrate W by the patterned radiation beam (the exposure phase), it is necessary to move the substrate W relative to the projection system PS. This may be achieved in two steps using a long-stroke module to cover most of the distance required (but with relatively coarse position control) and a short-stroke module mounted to the long stroke module for finer position adjustment.

To provide the capacity to deal with larger substrates and higher throughputs, the weights of the short-stroke module, long-stroke module and/or the actuators associated with each are likely to rise considerably. As a result, the forces that need to be applied to drive acceleration of the long-stroke module (and the short-stroke module that is attached to it) are expected to become very large in such systems. Where planar motors involving coils and magnets are used to provide these forces, although providing for relatively unconstrained motion of the substrate table, power dissipation, which varies as the square of the current applied, and reliability, are expected to become significant limiting issues.

According to disclosed embodiments, these problems are addressed by driving movement of the substrate table WT using a more efficient drive system involving use of a single shuttle that is configured to move parallel to a given direction parallel to the substrate and which is located to one side only of the substrate table WT. According to particular implementations, the drive system uses two different types of drive mechanism operating in parallel. For example, a magnet and coil system (in which a magnet is attached to the substrate table WT and driving coils are attached to the balance mass beneath, or vice versa) is configured to operate in parallel with either or both of a shuttle driver 16 and a shuttle connector driver 18.

Although the detailed examples refer to driving of a substrate table (i.e., a table capable of supporting a substrate), the drive system is not limited to driving movement of a substrate table and can be applied for driving movement of any carrier, for example a carrier used for measurement purposes, for example to calibrate the lithography apparatus, or a carrier for supporting a patterning device.

Figure 2A:
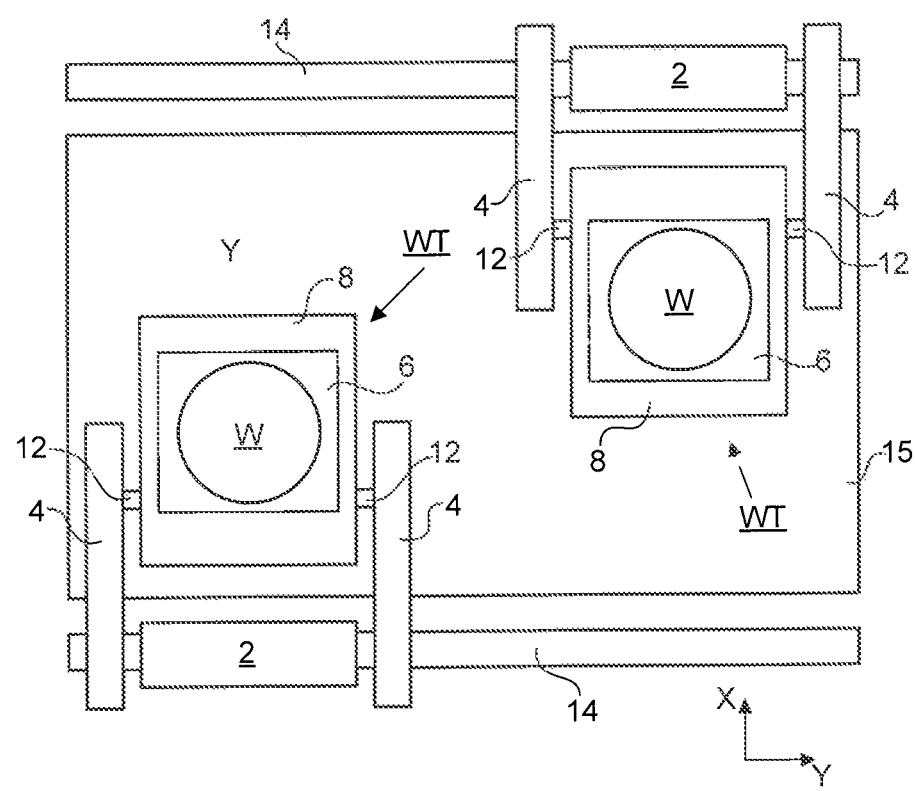
FIG. 2A is a schematic top view of a twin-stage system having two substrate tables, each connected to a shuttle via a shuttle connector.
Figure 2B:
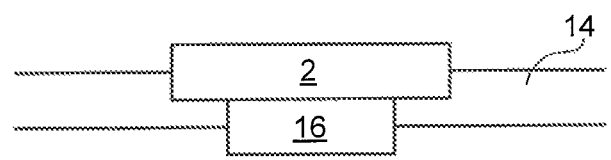
FIG. 2B is a schematic side view of a shuttle, shuttle track and shuttle driver.
Figure 2C:
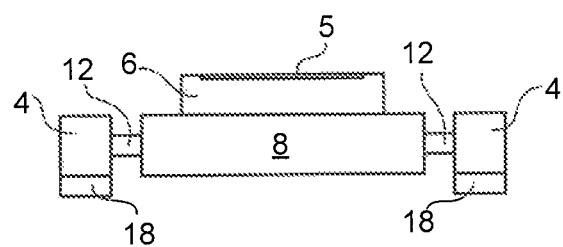
FIG. 2C is a schematic side view of a substrate table, shuttle connector and shuttle connector driver.
Figure 2D:
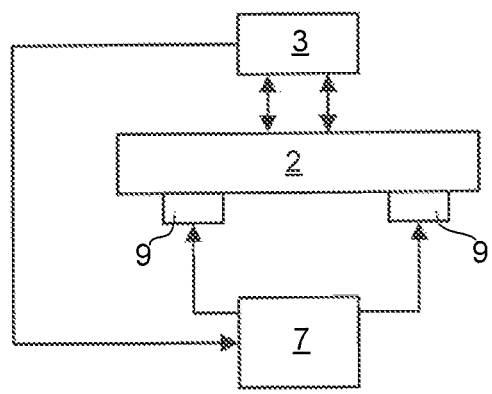
FIG. 2D is a schematic side view of a shuttle and torque compensator.

FIGS. 2A-D illustrate an example arrangement comprising two substrate tables. FIG. 2A is a schematic plan view of the overall system, FIG. 2B is a schematic side view of a shuttle 2 and a shutter driver 16, FIG. 2C is a schematic side view of one of the substrate tables WT and a shuttle connector driver 18, and FIG. 2D is a schematic side view of a torque compensator control system for the shuttle 2.

Two substrate tables WT are provided so that a substrate W can be taken through the measurement phase (where the newly mounted substrate W is characterized prior to exposure) on one substrate table WT while another substrate W can be taken through the exposure phase (where the patterned radiation beam is applied to the substrate W) on the other substrate table WT. In this example, each substrate table WT comprises a long-stroke carrier 8 and a short-stroke stage 6 mounted thereon, with the substrate W mounted on the short-stroke stage 6.

The "drive system" corresponds to the long-stroke module in this instance. However, the approach is also applicable to systems that do not use a combination of long- and short-stroke modules, for example where the drive system is sufficiently accurate to provide the necessary degree of position control without requiring a separate short-stroke module.

In the following description, motion of the substrate table WT is described relative to a Cartesian coordinate system in which the X- and Y-axes lie in a plane parallel to that of the substrate W and upper surface of the substrate table WT, and the Z-axis is aligned with the final element of the projection system PS (perpendicular to the X- and Y-axes) and approximately parallel to the direction of incidence of the patterned radiation beam on the substrate W.

In this example, the drive system comprises two shuttles 2 which are each constrained to move along the Y-axis along a different one of two tracks 14 positioned laterally outside of a zone of movement of the substrate table WT. For systems comprising only a single substrate table WT, only one shuttle 2 and track 14 would be needed.

Each substrate table WT is specifically configured to be connected to one and only one shuttle WT at any one time, and the shuttle is always positioned to one side of the substrate table WT only, so that the other substrate table WT can pass by in the Y direction when the substrate table WT is in a retracted position (close to its shuttle 2).

Each of the shuttles 2 is connected to its one of the substrate tables WT via a shuttle connector 4 and a coupling 12. The shuttle connector 4 and coupling 12 are configured so as to be able to transmit forces (along the Y-axis) from the shuttle 2 to the substrate table WT, along the Y-axis when the shuttle 2 is driven, and/or along the X-axis when the shuttle connector 4 is driven. Desirably, the coupling 12 is also configured to apply forces to the substrate table W parallel to the Z-axis. The coupling 12 can be in an active configuration (e.g., based on a reluctance actuator, permanent magnet system, or Lorentz motor), or in a passive configuration (e.g., elastic coupling, airbearing) or a combination. A more detailed description of an active embodiment is given further below reference to FIG. 11.

As shown in FIG. 2B, in the present embodiment a shuttle driver 18 is provided for driving the shuttle 2, and therefore the substrate table WT, in a direction parallel to the Y-axis. The shuttle driver 16 should be configured to be able to provide at least 10% of the force parallel to the Y-axis that is required during either or both of the exposure and measurement phases, desirably at least 50%, at least 75%, at least 90%, or at least 95%. Alternatively or additionally, the shuttle driver 16 should be configured to be able to provide at least 10% of a maximum force required during the exposure phase, desirably at least 50%, at least 75%, at least 90%, or at least 95%. According to an embodiment, the shuttle driver 16 is configured to provide all of the force parallel to the Y-axis that is required during the exposure phase. In this way, the portion of the drive system responsible for providing the forces along X can be greatly simplified and made more efficient.

In alternative embodiments, the shuttle 2 may be passive, with no shuttle driver provided, or with a shuttle driver having only minimal capacity for applying a force to the substrate table WT (i.e., less than 10% of the force parallel to the Y-axis that is required during either or both of the exposure and measurement phases). In this case, movement of the substrate table WT parallel to the Y-axis is driven by alternative means, for example exclusively by a magnet and coil system (in which a magnet is attached to the substrate table WT and driving coils are attached to a balance mass beneath, or vice versa, for example).

The shuttle connector 4 is configured to allow movement of the substrate WT parallel to the X-axis, i.e., towards and away from the shuttle 2. In the present embodiment, as shown in FIG. 2C, the shuttle connector 4 comprises a shuttle connector driver 18 that is configured to supply at least 10% of the force parallel to the X-axis that is required during either or both of the exposure and measurement phases, desirably at least 50%, at least 75%, at least 90%, or at least 95%. Alternatively or additionally, the shuttle connector driver 18 should be configured to be able to provide at least 10% of a maximum force required during the exposure phase, desirably at least 50%, at least 75%, at least 90%, or at least 95%. According to an embodiment, the shuttle connector driver 18 is configured to provide all of the force parallel to the X-axis that is required during the exposure phase. In this way, the portion of the drive system responsible for providing the forces along Y can be greatly simplified and made more efficient.

Alternatively, the shuttle connector 4 may be passive, providing no force between the shuttle 2 and the substrate table WT (or less than 10% of the force parallel to the X-axis that is required during either or both of the exposure and measurement phases). In this case, movement of the substrate table WT parallel to the X-axis is driven by alternative means, for example exclusively by a magnet and coil system.

The drive system can lead to significant torques being applied to the shuttle 2 parallel to the Z-axis. It is therefore desirable to provide a torque compensator for the shuttle 2. The torque compensator may be passive or active or a combination of the two. For example, electromagnetic reluctance actuators may be provided in feedforward. Alternatively or additionally, passive bearing systems may be used.

FIG. 2D shows an example configuration of a torque compensator comprising a sensor 3 for measuring a rotation of the shuttle 2 about the Z-axis, a control system 7, and torque actuator 9. The torque actuator 9 is controlled by the control system 7 to apply a torque (opposing any torque applied to the shuttle 2 due to driving of the carrier by the drive system) to the shuttle 2 as a function of the output of the sensor 3. Excessive torques on the shuttle 2 and associated wear, accuracy and/or reliability problems can therefore be avoided or mitigated.

A balance mass 15 may be provided that is movably mounted relative to the substrate tables WT and configured to balance the momentum of the substrate tables WT. Typically, arranging for the reaction forces from accelerations and decelerations of the substrate tables WT to act on the balance mass 15, and dynamically isolating the balance mass 15 from all components other than the substrate tables WT, achieve this. For example, the tracks 14 could be mechanically attached to the balance mass 15, so that the reaction forces applied to the track when driving the shuttle 2 are transferred to the balance mass 15. Forces can also be transferred to the balance mass 15 electromagnetically between coils and permanent magnets of the magnet and coil system, described further below.

In addition to the driving forces provided by the shuttle driver 16 and/or the shuttle connector driver 18, the drive system may also comprise a magnet and coil system for applying to the substrate table WT a component of force parallel to the Y-axis and/or a component of force parallel to the X-axis, thus working in parallel with the shuttle driver 16 and/or the shuttle connector driver 18. The magnet and coil system may consist of a permanent magnet attached to the substrate table WT or to the balance mass 15 together with a coil system attached respectively to the balance mass 15 or the substrate table WT. The required force is obtained electromagnetically by driving an appropriate current through the coils.

Because the magnet and coil system works in parallel with either or both of the shuttle driver 16 and the shuttle connector driver 18, the amount of force that needs to be generated by the magnet and coil system is reduced relative to the case where the magnet and coil system is entirely responsible for applying the necessary forces in the X-Y plane (as in some prior art systems). The size of the current that needs to be driven through the coils can therefore be lowered and power dissipation, which varies as the square of the current, is also reduced.

In the case where the shuttle driver 16 is configured to provide substantially all of the force that is required parallel to the Y-axis, the magnet and coil system can be configured only to apply significant forces parallel to the X-axis. This greatly simplifies the required operation of the magnet and coil system, and provides significant scope for improvements in terms of efficiency.

Similar efficiency gains from simplification of the magnet and coil system can be obtained where the shuttle connector driver 18 is configured to provide substantially all of the force that is required parallel to the X-axis. In this case, the magnet and coil system could be configured to provide significant forces only parallel to the Y-axis.

More generally, applying forces to the substrate table WT via systems which operate in close vertical proximity to the center of mass of the substrate table WT helps to avoid torques about axes parallel to the X-Y plane relative to systems (such as the magnet and coil systems) where the force is applied significantly below the center of mass of the substrate table WT. Power loss associated with compensating such torques is therefore reduced.

In prior art systems, a magnet and coil system is configured to provide the upthrust for levitating the substrate table WT, in addition to the lateral forces that are necessary to drive the scanning motion associated with the exposure and measurement phases. According to embodiments of the present development, alternative means are provided for levitating the substrate tables WT, such as a so-called "air foot" or "air bearing", which rely on a flow of gas to provide a localized region of elevated gas pressure beneath the substrate tables WT that is sufficient to support their weight. This further reduction in the requirements of the magnet and coil system provides further scope for simplification and/or reduction in the currents required in the coils (and therefore in the power loss associated with running the magnet and coil system).

According to further embodiments of the present development, a backiron, which is a body having a high relative magnetic permeability, may be provided for enhancing the interaction between the permanent magnets and coils of the magnet and coil system. By enhancing the interaction in this way the driving current required for a given lateral force on the substrate table WT is reduced, thus reducing power dissipation. The relative permeability of the backiron is desirably greater than 100, more desirably greater than 150, greater than 200, or greater than 500. The backiron may be provided in the form of a plate, having a substantially planar form and positioned behind the coils (i.e., so that the coils are positioned between the backiron and the permanents magnets), for example.

According to embodiments of the present development, the magnet and coil system is configured such that the permanent magnets are attached to the substrate table WT and the coils are attached to the balance mass. The drive system makes supporting of the permanent magnets by the substrate table WT feasible and the overall approach simplifies the structure of the substrate table WT relative to systems where the substrate table WT has the coils and the permanent magnets are attached to the balance mass. For example, power cables and coolant hoses associated with the coils no longer need to be fed to the moving substrate table WT. Magnetic cross-talk to the short-stroke stage can also be reduced. In addition, where a backiron is provided, the weight of the backiron will be supported by the balance mass rather than by the substrate table WT and will not therefore add to the total mass of components that has to be scanned during the exposure phase with the substrate table WT, thus reducing the forces that have to be applied.

In the arrangement of FIGS. 2A-D, the shuttle connectors 4 are configured to connect to the substrate table WT laterally relative to the Y-axis, with one of the two shuttle connectors 4 being connected to the substrate table WT at a leading edge of the substrate table WT relative to the Y-axis and the other of the two shuttle connectors 4 being connected to the substrate table WT at the trailing edge.

Figure 3:
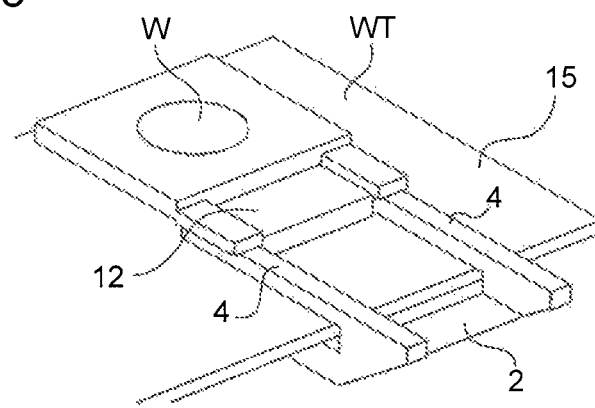
FIG. 3 is a schematic perspective view of a substrate table and a shuttle connector, where the shuttle connector is configured to connect to the substrate table at connection points located between the shuttle and the substrate table.

FIG. 3 is a schematic illustration of an alternative embodiment in which the coupling 12 between the shuttle connectors 4 and the substrate table WT is made at a position between the substrate table WT and the shuttle 2. Relative to the arrangement of FIGS. 2A-D, this approach provides greater freedom for movement of the substrate table WT parallel to the Y-axis by reducing the effective width of the substrate table WT along Y (the "width" no longer includes the width of the shuttle connectors 4). On the other hand, the arrangement of FIG. 2A-D may be relatively more effective where the shuttle connectors 4 are also used to limit and/or correct rotations of the substrate table WT about the Z-axis, because the points of contact between the shuttle connectors 4 and the substrate table WT are further apart in the arrangement of FIGS. 2A-D relative to the arrangement of FIG. 3, which should generally allow greater control of torque.

Figure 4:
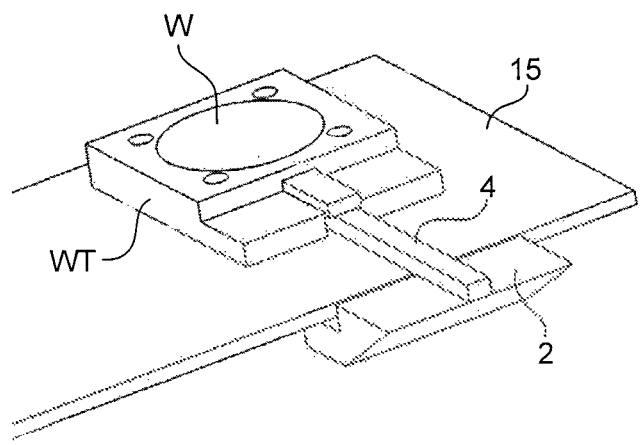
FIG. 4 is a schematic perspective view of a substrate table and a shuttle connector, where the shuttle connector comprises a single arm connected at a central position to the substrate table.

In the arrangements of FIGS. 2A-D and 3, two shuttle connectors 4 are provided for each substrate table WT. This approach may be beneficial for the purposes of limiting and/or controlling torque about the Z-axis, as well as for ensuring that the connection between the shuttle 2 and the substrate table WT is sufficiently rigid to transmit the required forces from the shuttle driver 16 and/or shuttle connector driver 18 to the substrate table WT effectively. However, it is also possible to use a single arm shuttle connector 4. FIG. 4 shows an example of this type. A benefit of this approach is that it can be implemented more simply, potentially saving weight as well as cost. This is particularly the case where the shuttle connectors 4 are to be driven by the shuttle connector driver 18. In a two-arm configuration, care may need to be taken to ensure that the forces parallel to X are applied equally by both arms, to avoid creating a torque along Z. No such problem arises where a single arm is provided. In addition, it is easier to arrange for the force parallel to X to act through a line that is parallel to the Z-axis and which passes through, or very near to, the center of mass of the substrate table WT. This avoids or minimizes any torque parallel to the Z-axis arising from the force applied to the substrate table WT by the shuttle connector 4 parallel to the X-axis.

The connection point at which the shuttle connector 4 applies the force parallel to the X-axis is desirably chosen so as to be as close as possible to the center of mass of the substrate table WT. The connection point may lie at or very near to a line that is parallel to the Z-axis and which passes through the center of mass of the substrate table WT (so as to match the X- and Y-coordinates of the center of mass), for example, so that the force applied by the shuttle connector driver 18 cannot apply any significant torque parallel to the Z-axis. More desirably, the connection point lies at or very near to the center of mass of the substrate table WT (i.e., so as to match the Z-coordinate of the center of mass also), so that the force applied by the shuttle connector driver 18 cannot cause a significant torque parallel to the Y-axis either, or at least any such torque is minimal.

Figure 5:
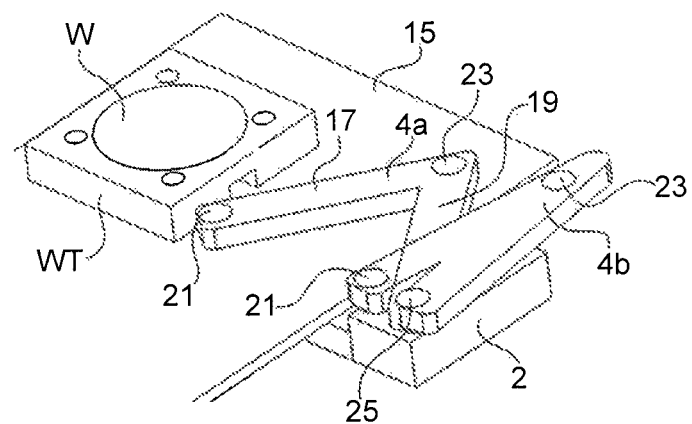
FIG. 5 is a schematic perspective view of a substrate table and a shuttle connector, where the shuttle connector comprises an articulated arm.

FIG. 5 shows an alternative arrangement in which the shuttle connector 4a/4b is articulated in form, comprising a first member 17 and a second member 19. Two configurations of the shuttle connector 4a/4b are shown: an extended configuration 4a (which corresponds to the illustrated position of the substrate table WT), and a retracted configuration 4b (which would correspond to a retracted position of the substrate table WT, closer to the shuttle 2, which is not shown). The first member 17 is connected at one end to the substrate table WT at pivot point 21 and at the other end to one end of the second member 19 at pivot point 23. The other end of the second member 19 is connected to the shuttle 2 at pivot point 25. Pivot points 21, 23 and 25 are connections that allow pivoting (i.e., rotation) of elements connected together at the pivot points about an axis parallel to the Z-axis relative to each other, so that the articulated arm can extend and retract within a plane perpendicular to the Z-axis. The shuttle connector 4a/4b shown comprises just two members 17/19, but further members may be provided; for example, the shuttle connector may comprise 3, 4 or 5 articulated members.

In one example, the members 17/19 of the shuttle connector 4a/4b are arranged so that the angles between the members 17/19 are as small as possible for a given degree of extension of the shuttle connector 4a/4b. In the arrangement of FIG. 5, in which two members 17/19 are provided, this is achieved by arranging for the pivot points 21 and 25 (i.e., the pivot points respectively connecting the members 17 and 19 to the substrate table WT and the shuttle 2) to be displaced to one and the same side of a "dividing plane" lying perpendicular to the Y-axis and passing through the center of masses of the substrate table WT and the shuttle 2, along the +Y or −Y direction. In one example, the pivot points are displaced as far as possible away from the dividing plane. More generally, where the shuttle connector 4 comprises an even number of articulated members, the pivot points connecting the outermost members to the substrate table WT and the shuttle 2 should be positioned to one and the same side of the dividing plane. In the case of a shuttle member connector 4 comprising an odd number of articulated members, the pivot points connecting the outermost members to the substrate table WT and the shuttle 2 should again be displaced relative to the dividing plane, but on opposite sides of the dividing plane.

More generally, the articulated shuttle connector 4a/4b is desirably configured such that the angle between neighboring members 17/19 is less than 10 degrees when the articulated shuttle connector 4a/4b is in the fully retracted position, with the substrate table WT closest to the shuttle 2, more desirably less than 5 degrees. Alternatively or additionally, the articulated shuttle connector 4a/4b is desirably configured such that the angle between neighboring members 17/19 is less than 150 degrees when the shuttle is in the fully extended position, with the substrate table WT furthest from the shuttle 2, more desirably less than 120 degrees.

By keeping the angle between individual members of the articulated shuttle connector 4a/4b as small as possible, it is possible to use the shuttle connector 4a/4b to apply forces parallel to the X-axis more efficiently.

Where the shuttle connector 4a/4b is to be driven by a shuttle connector driver 18, this may be achieved by driving rotation directly at one or more of the pivot points. For example, the shuttle connector driver may be configured to apply a torque parallel to the Z-axis at the pivot point 25 connecting the second member 19 of the shuttle connector 4a/4b to the shuttle 2, at the pivot point 23 connecting the first and second members 17 and 19, and/or at the pivot point 21 connecting the first member 17 to the substrate table WT. Where fewer than all of the pivot points are driven, means may need to be provided for constraining the driven motion of the substrate table WT relative to the shuttle 2 to a direction parallel to the X-axis. Such means may also be desirable when all of the pivot points are driven, although in this case it may be more convenient to coordinate driving of the pivot points to ensure that the direction of motion of the substrate table WT corresponds to requirements. Although it is generally expected that the shuttle connector 4 will be configured to allow and/or drive motion of the substrate table WT parallel to the X-axis, it may also be desirable to configure the shuttle connector to allow and/or drive motion in directions other than parallel to the X-axis; for example, slight deviations relative to the direction parallel to the X-axis (i.e., components parallel to the Y-axis) may be allowed and/or driven.

Figure 6:
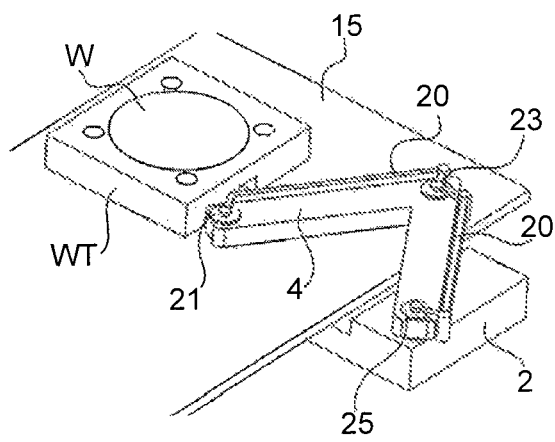
FIG. 6 is a schematic perspective view of a substrate table and a shuttle connector, where the shuttle connector comprises an articulated arm with a direction-constraining mechanism.
Figure 7:
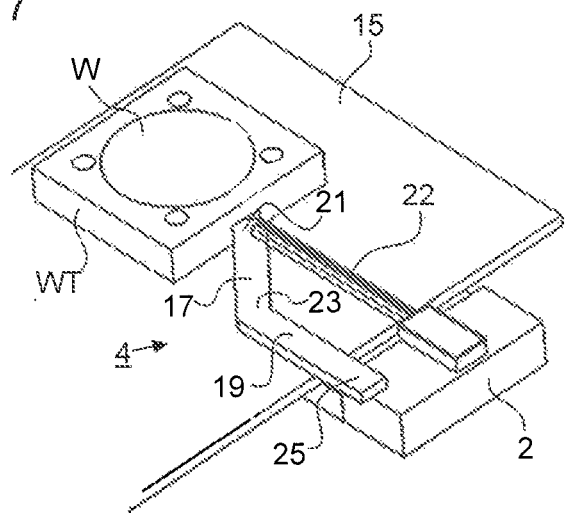
FIG. 7 is a schematic perspective view of a substrate table and a shuttle connector, where the shuttle connector comprises an articulated arm and a bar mechanism.

FIG. 6 shows an example arrangement comprising a direction-constraining mechanism 20 for an articulated shuttle connector 4. The direction-constraining mechanism 20 is configured to constrain motion of the substrate table WT relative to the shuttle 2 to be parallel to the X-axis. In this way, driving of fewer than all of the pivot points 21/23/25 is effective to drive the substrate table WT parallel to the X-axis relative to the shuttle 2. The shuttle connector driver 18 can therefore be simplified, thus reducing cost and potentially improving reliability FIG. 7 shows an alternative arrangement in which the shuttle connector 4 has an articulated form comprising a first member 17 and a second member 19 connected to the substrate table WT and to each other via pivot points 21, 23 and 25 in a similar manner to the embodiments of FIGS. 5 and 6. The arrangement of FIG. 7 differs from that of FIGS. 5 and 6 in that the pivot point 21 at which the first member 17 is connected to the substrate table WT is laterally central relative to the Y-axis rather than displaced in a +Y or −Y direction. In other words, the pivot point 21 is within or near to the dividing plane perpendicular to the Y-axis and passing through the center of masses of the substrate table WT and the shuttle 2. When the shuttle connector 4 is driven by a shuttle connector driver 18, the forces parallel to the X-axis are thus applied in such a way as to avoid or minimize torques parallel to the Z-axis. As discussed above, the shuttle connector driver 18 can be configured to drive movement of the substrate table WT parallel to the X-axis by applying torques at one or more pivot points of an articulated shuttle connector 4. This approach could in principle be applied to the shuttle connector 4 shown in FIG. 7. In this case, a bar mechanism 22 may be provided for constraining motion of the shuttle 2 relative to the substrate table WT to be parallel to the X-axis. Alternatively or additionally, the bar mechanism 22 may be configured to drive motion of the substrate table WT parallel to the X-axis, with the shuttle connector 4 being passive.

Figure 8:
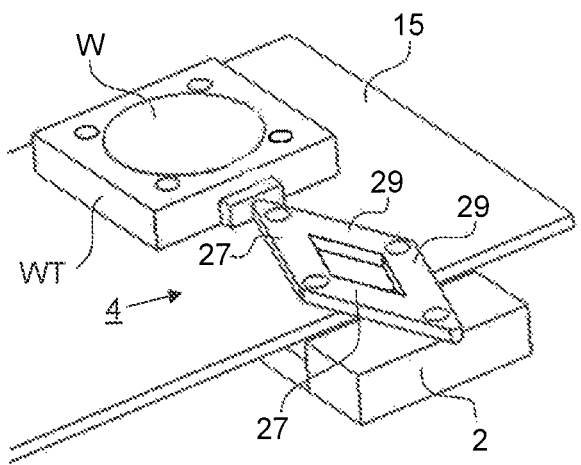
FIG. 8 is a schematic perspective view of a substrate table and a shuttle connector, where the shuttle connector comprises two articulated arms, arranged symmetrically.

FIG. 8 illustrates a further alternative arrangement in which the shuttle connector 4 is provided with two articulated arms 27 and 29, arranged symmetrically with respect to a symmetry plane perpendicular to the Y-axis. Although the symmetry plane may in principle be located at various positions along Y, it is desirable for the purposes of avoiding or minimizing torques parallel to the Z-axis for the symmetry axis to pass though or close to the center of mass of the substrate table WT. In the arrangement shown, the two articulated arms 27 and 29 are joined to the substrate table WT at a common connection point. In this way only a single connection point is required at the substrate table WT, thereby simplifying the structure of the shuttle connector 4 and potentially reducing weight and/or improving reliability. In addition, this approach facilitates connection of the shuttle connector 4 at a point on the substrate table WT that lies on a plane perpendicular to the Y-axis and passing through the center of mass of the substrate table WT, thereby avoiding or minimizing torques parallel to the Z-axis.

It is also possible to arrange for the articulated arms to connect to the substrate table WT at different points, separated from each other in a direction parallel to the Y-axis and/or X-axis.

Arranging arms of the shuttle connector 4 symmetrically in this manner helps to ensure sufficient rigidity with respect to the forces applied parallel to the Y-axis by movement of the shuttle 2, so that these forces are transmitted efficiently to the substrate table WT.

Figure 9:
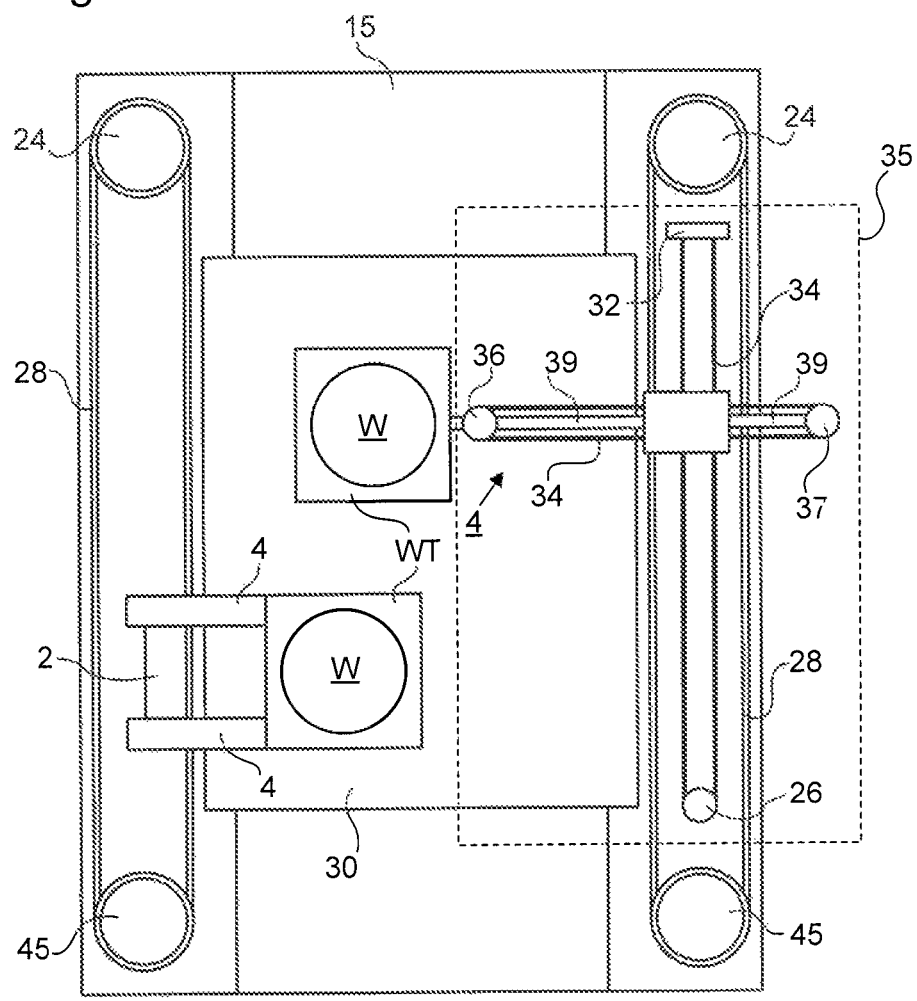
FIG. 9 is a schematic top view of a twin-stage system having two substrate tables, in which belt drive systems are used to power movement of the shuttle and/or the shuttle connector and the substrate table.

FIG. 9 shows an alternative arrangement in which the shuttle driver 16 is configured to drive movement of the shuttle 2 via a belt system and/or the shuttle connector driver 18 is configured to drive movement of the substrate table WT relative to the shuttle 2 via a belt system. A benefit of this approach is that fewer components associated with the shuttle driver 16 and the shuttle connector driver 18 need to be located on the shuttle 2 or on the shuttle connector 4 and substrate table WT. This approach thus reduces the mass of components having a fixed spatial relationship with the substrate W that has to be moved during the exposure and/or measurement phases, thus reducing the forces that need to be applied to achieve the required motion.

FIG. 9 illustrates a system with two substrate tables WT. Each of the substrate tables WT has an associated shuttle 2 which is driven by a shuttle belt system (described in further detail below). The upper of the two substrate tables WT is connected to a shuttle connector 4 that is configured to be driven by a shuttle connector belt system (described further below). The lower of the two substrate tables WT is connected to its shuttle 2 via a shuttle connector 4 that is not driven by a belt system (although it would also be possible to provide both of the substrate tables WT with shuttle connector belt systems if desired).

The shuttle belt system comprises a belt 28 arranged in a continuous loop between a shuttle passive spindle 24 and a shuttle drive spindle 45. The shuttle drive spindle 45 is connected to a powered drive mechanism 16 configured to rotate and engage with the belt 28 in such a way as to impart motion to the loop of belt 28 in a clockwise or counterclockwise direction as required. The shuttle 2 is connected to the belt 28 fixedly, such that motion of the belt 28 causes a corresponding motion of the shuttle 2. The shuttle 2 is connected to the belt 28 at a position at which motion of the belt 28 caused by the shuttle drive spindle 45 is parallel to the Y-axis over a desired range of positions. A guiding device, such as a track, may also be provided for guiding motion of the shuttle 2 parallel to the Y-axis.

Figure 10:
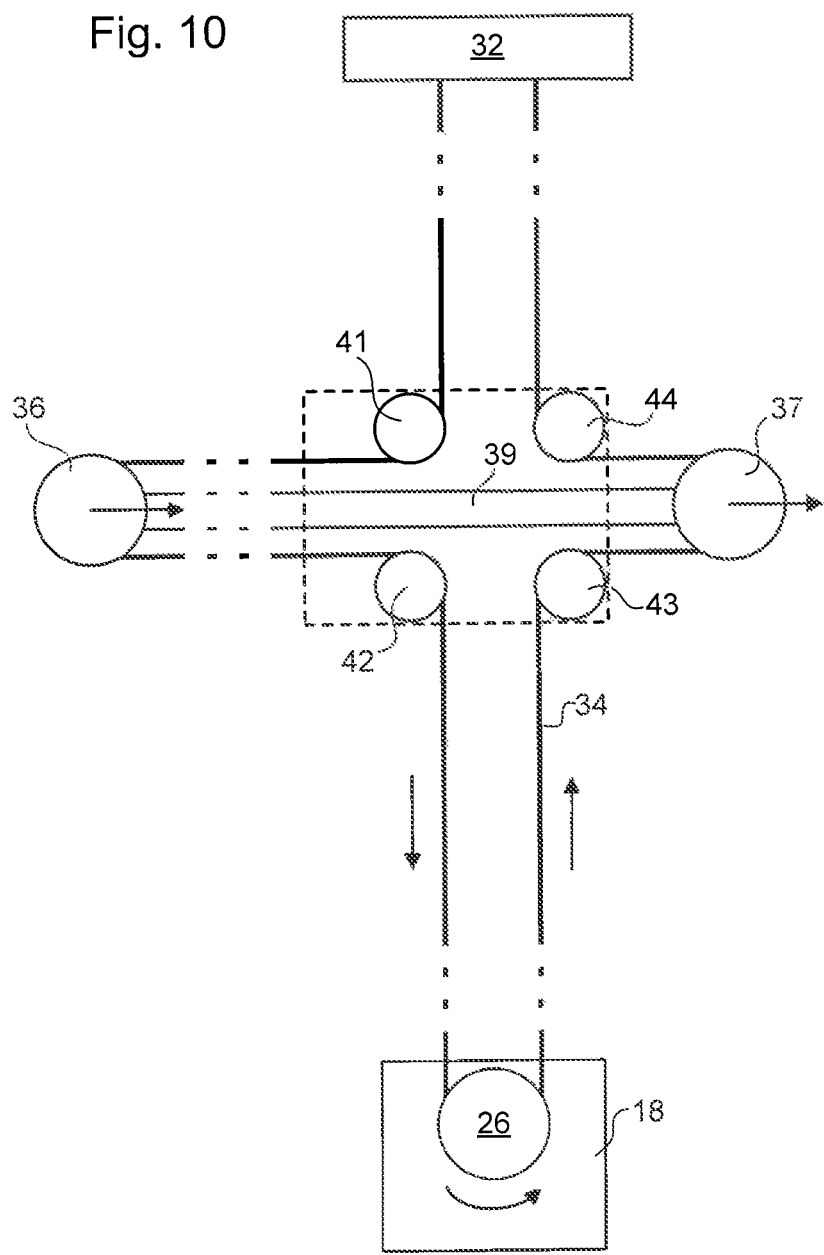
FIG. 10 is a magnified view of the shuttle connector belt system of FIG. 9.

The shuttle connector belt system is shown within the broken line box 35 in FIG. 9, and in more detail in FIG. 10, which shows only those features within the broken line box 35. FIG. 10 also shows the interior structure of the shuttle 2, the outline of which is schematically shown in broken lines. The broken line portions of the belt 34 of the shuttle connector belt system shown in FIG. 10 represent portions of the belt 34 that have been omitted from FIG. 10 for clarity.

The shuffle connector belt system comprises a belt 34, an anchor portion 32 to which two ends of the belt 34 are fixedly connected, and a shuttle connector drive spindle 26, which is driven by the shuttle connector driver 18 (shown in FIG. 10). The shuttle 2 is provided with a set of shuttle spindles 41/42/43/44, which direct the belt 34 to form a first loop and a second loop extending in opposite directions with respect to each other parallel to the X-axis. The shuttle connector 4 is provided with a substrate table spindle 36 and an opposing spindle 37, connected together via separation arm 39. The separation arm 39 is mounted so as to be movable parallel to the X-axis and is configured to maintain a fixed distance between the substrate table spindle 36 and the opposing spindle 37. The portion of the belt 34 forming the first loop is wound around the substrate table spindle 36 while the portion of the belt 34 forming the second loop is wound around the opposing spindle 37.

The shuttle connector driver 18 is configured to rotate the shuttle connector drive spindle 26 in a clockwise or counter-clockwise direction. The belt 34 forms a continuous loop from a first of the two connections to the anchor portion 32, past the spindles 41, 36, 42, 26, 43, 37, and 44, in that order, back to the second of the two connections to the anchor portion 32. When the shuttle connector drive spindle 26 is driven in the counterclockwise direction (as shown by the arrows in FIG. 10), the length of belt 34 running from the first connection to the anchor portion 32 to the shuttle connector drive spindle 26 is shortened and the length of belt 34 running from the shuttle connector drive spindle 26 to the second connection to the anchor portion 32 is lengthened by a corresponding amount, such that the separation arm 39 is forced to the right in the diagram, thus pulling the substrate table WT towards the shuttle 2 in a direction parallel to the X-axis. Similarly, clockwise rotation of the shuttle connector drive spindle 26 will cause the separation arm 39 to be forced to the left in the diagram, thus pushing the substrate table WT away from the shuttle 2 in a direction parallel to the X-axis.

The position of the substrate table WT along X can thus be conveniently varied by controlling the rotation of the shuttle connector drive spindle 26. The weight of the shuttle 2 is reduced relative to arrangements which do not use such a belt system or similar because the heavier elements of the shuttle connector driver 18 can be attached to the balance mass 15 rather than to the shuttle 2. The system of spindles 41/42/43/44 and shuttle frame can be relatively lightweight.

The arrangements shown in FIGS. 9 and 10 represent specific embodiments of belt drive systems for driving motion of the substrate table WT parallel to Y and/or X. Other belt drive systems may also be provided, which have the same benefits of minimizing the weight of elements that have to be moved during the exposure and/or measurement phases by locating a large proportion of the mass of the respective drive systems on a portion of the lithography apparatus (e.g., the balance mass 15) that does not move to the same extent as the substrate table WT during the exposure and/or measurement phases.

In all of the above arrangements where a connection point between the shuttle connector 4 and the substrate table WT is shown between the substrate table WT and the shuttle 2, it should be understood that the connection point could alternatively be arranged to be beneath the substrate table WT or at a height that is substantially level with the center of mass of the substrate table WT and/or lying substantially on a line oriented parallel to the Z-axis that passes through the center of mass of the substrate table WT. Various different ways of implementing the shuttle connector and shuttle connector driver have been described above with reference to a single substrate table WT. In the case of a twin-stage system having two substrate tables WT, the same type of shuttle, shuttle connector, shuttle driver and shuttle connector driver may be used for both substrate tables WT. Alternatively, any combination of the described arrangements may be used, with one substrate table WT being configured differently from the other substrate table WT.

The shuttle driver 16 and/or the shuttle connector driver 18 may be implemented using any one of the following types of drives or any combination thereof: a linear motor, a tubular electromagnetic actuator, a hydraulic actuator or a ball screw drive. Other types of drive mechanism may also be selected as required.

A linear motor can be of an "ironcore" or "ironless" type. An ironcore linear motor consists of a magnet array with a coilblock (with iron), while an ironless linear motor consists of a dual sided magnet array track (U-shape) with coils (without iron) moving through the track. Either the magnets or the coils can be connected to the stationary part Tubular electromagnetic actuators are particularly appropriate because they are very efficient and do not have end windings. The full copper volume of the coil contributes to the force generation. A tubular actuator is basically a linear motor that is axissymmteric around the driving axis. Another way of looking at it is a rotary permanent magnet motor with an axial magnetization and winding direction instead of radial, thus providing linear motion instead of rotation.

Hydraulic actuators are particularly appropriate because they are capable of providing a very high force density, i.e., they can deliver high forces while occupying a relatively small volume.

Ball screw drives are particularly appropriate because they are able to apply or withstand high thrust loads with minimal internal friction and without backlash. Very high efficiencies (in excess of 90%) are possible.

The shuttle driver 16 and/or shuttle connector driver 18 may be configured to operate in a feedforward configuration with parallel driving being provided by the magnet and coil system in a feedback configuration.

The shuttle connectors 4 described above may be configured to connect to the substrate table WT by means of an elastic coupling or by means of an active coupling, for example a magnetically mediated coupling using reluctance actuators, opposed permanents magnets, Lorentz actuators, or a combination of these. The coupling may be configured to apply forces in one or more of the X, Y and Z directions (active or passive) and torques about one or more of the X, Y and Z axes (active or passive).

Figure 11:
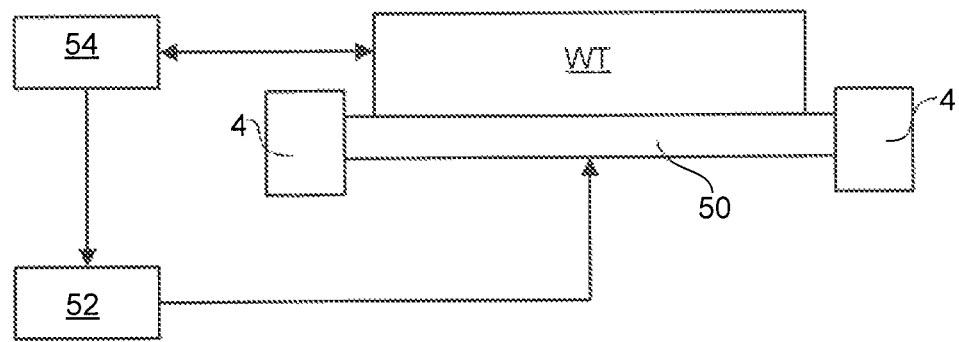
FIG. 11 is a schematic side view of an active coupling between the shuttle connector and the substrate table.

FIG. 11 illustrates an example configuration in which a control system 52 is provided for controlling operation of an actuator 50 coupled to the substrate table WT by reference to the output of a sensor 54 for measuring the position and/or rotational orientation of the substrate table WT relative to one or more of the X, Y and Z axes (relative to a fixed frame of reference, independent of that of the shuttle), using feedback and/or feedforward.

More generally, the use of an active coupling (or a coupling having an active component) between the drive system and the carrier is beneficial because it allows the position of the carrier to be controlled independently of the dynamics of the drive system. In particular, it means that the requirements for positional accuracy of the drive system can be greatly relaxed. For example, with respect to displacement parallel to a given axis, the drive system could be configured to position the carrier within about 0.5 mm of a target position and the active coupling could be arranged to fine tune the position to within required tolerances. Similar considerations apply with respect to fine adjustment of a rotational orientation of the carrier about a given axis.

In an embodiment, the shuttle connector driver comprises one or more of the following: a linear motor, a tubular electromagnetic actuator, a hydraulic actuator, a ball screw drive.

In an embodiment, the first and second pivot positions are located to one and the same side of a plane perpendicular to the Y-axis that contains the center of mass of the combination of carrier and shuttle.

In an embodiment, the articulated arm is arranged so that the angle between each neighboring pair of the at least two members is less than 5 degrees when the articulated arm is in a fully retracted configuration, with the carrier closest to the shuttle.

In an embodiment, the articulated arm is arranged so that the angle between each neighboring pair of the at least two members is less than 120 degrees when the articulated arm is in a fully extended configuration, with the carrier furthest from the shuttle.

In an embodiment, a shuttle connector driver is configured to apply a torque to at least one of: the pivotable connection between the articulated arm and the shuttle, the pivotable connection between the articulated arm and the carrier, and a pivotable connection between two of the at least two members.

In an embodiment, the shuttle connector is configured to connect to the carrier at a point directly below or above the center of mass of the carrier, within a margin of 20% of the smallest lateral dimension of the carrier in the X-Y plane with respect to deviations in the X-Y plane.

In an embodiment, the shuttle connector is configured to connect to the carrier at the center of mass of the carrier, within a margin of 20% of the smallest lateral dimension of the carrier in the X-Y plane with respect to deviations in the X-Y plane, and within a margin of 20% of the height of the carrier parallel to the Z-axis with respect to deviations along the Z-axis.

In an embodiment, the shuttle connector further comprises an additional articulated arm configured so that the two articulated arms are symmetrical to each other relative to a plane lying perpendicular to the Y-axis.

In an embodiment, the lithography apparatus further comprises a balance mass configured to receive reaction forces from driving of the carrier and move in response thereto to balance changes in momentum of the carrier and the shuttle belt driver is fixedly attached to the balance mass.

In an embodiment, the shuttle connector driver comprises a shuttle connector belt system, the shuttle connector belt system comprising a shuttle connector belt and a shutter connector belt driver configured to driving movement of at least a portion of the shuttle connector belt, the shuttle connector being engaged with the shuttle connector belt in such a way that the movement of at least a portion of the shuttle connector belt driver causes a corresponding movement of the carrier parallel to the X-axis.

In an embodiment, the lithography apparatus further comprises a balance mass configured to receive reaction forces from driving of the carrier and move in response thereto to balance changes in momentum of the carrier and the shuttle connector belt driver is fixedly attached to the balance mass.

In an embodiment, the carrier is a substrate table constructed to hold the substrate.

In an embodiment, the shuttle connector belt system comprises an anchor portion to which a first and a second end of the shuttle connector belt are fixedly connected, the anchor portion is mounted rigidly with respect to the shuttle connector belt driver so as to remain at a fixed distance therefrom, the shuttle connector belt is arranged to follow a first path from the first end of the shuttle connector belt to the shuttle connector belt driver and to follow a second path from the second end of the shuttle connector belt to the shuttle connector belt driver, driving of the shuttle connector belt by the shuttle connector belt driver in a first direction causes shortening of the first path relative to the second path, driving of the shuttle connector belt by the shuttle connector belt driver in a second direction causes lengthening of the first path relative to the second path, the carrier is engaged with the substrate connector belt such that when the first path is shortened relative to the second path the carrier is pulled towards the shuttle parallel to the X-axis and when the first path is lengthened relative to the second path the carrier is pushed away from the shuttle parallel to the X-axis.

In an embodiment, the lithographic apparatus further comprises a torque compensator configured to providing a torque to the shuttle that opposes a torque applied to the shuttle as a result of driving of the carrier by the drive system.

In an embodiment, the torque compensator comprises a sensor configured to measure a rotation of the shuttle about a Z-axis, orthogonal to the X- and Y-axes, and a controller configured to control the opposing torque applied by the torque compensator as a function of the output from the sensor.

Although specific reference may he made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

The invention claimed is:

1. A lithography apparatus comprising:
   a projection system configured to transfer a pattern from a patterning device onto a substrate;
   a carrier; and
   a drive system configured to move the carrier relative to the projection system in a horizontal plane, the drive system comprising:
   a magnet and coil system configured to:
      apply a first force to the carrier, and
      move the carrier along a first or second direction, the second direction being perpendicular to the first direction;
   a shuttle configured to move the carrier along the second direction, the shuttle being located to one side of the carrier;
   a shuttle driver configured to:
      apply a second force to the carrier via the shuttle, the second force being applied substantially simultaneously with the first force to the carrier, and
      drive the shuttle along the second direction; and
   a shuttle connector configured to:
      connect the shuttle to the carrier; and
      allow movement of the carrier relative to the shuttle along the first direction.

2. The lithography apparatus of claim 1, further comprising:
   a shuttle connector driver configured to drive movement of the carrier along the first direction via the shuttle connector, wherein the shuttle connector driver is configured to provide a third force to the carrier along the first direction, the third force being applied to the carrier in addition to the first force.

3. The lithography apparatus of claim 1, wherein the shuttle driver comprises at least one of:
   a linear motor;
   a tubular electromagnetic actuator;
   a hydraulic actuator; and
   a ball screw drive.

4. The lithography apparatus of claim 1, further comprising an active coupling between the carrier and the shuttle connector, the active coupling comprising:
   a sensor configured to measure a position of the carrier relative to a reference frame;
   an actuator configured to apply an actuating force between the carrier and the shuttle connector to adjust the position of the carrier relative to the shuttle connector; and
   a controller configured to control operation of the actuator as a function of an output from the sensor to control the position of the carrier relative to the reference frame.

5. The lithography apparatus of claim 1, wherein the shuttle connector comprises:
   an articulated arm comprising at least two members, the at least two members being configured to pivot with respect to each other about an axis perpendicular to the horizontal plane, wherein:
      a first member of the at least two members are pivotal connected to the carrier at a first pivot position; and a second member of the at least two members are pivotably connected to the shuttle at a second pivot position.

6. The lithography apparatus of claim 1, wherein the shuttle connector comprises a single arm extending between the shuttle and the carrier.

7. The lithography apparatus of claim 1, wherein the shuttle connector comprises two arms extending between the shuttle and the carrier, a first arm of the two arms being connected to the carrier at a first position on the carrier and a second arm of the two arms being connected to the carrier at a second position on the carrier, the first and second positions being separated from each other along the second direction.

8. The lithography apparatus of claim 1, wherein the shuttle connector is configured to connect to the carrier beneath the carrier.

9. The lithography apparatus of claim 1, wherein the shuttle driver comprises a shuttle belt system, the shuttle belt system comprising:
a shuttle belt; and
a shuttle belt driver configured to drive movement of at least a portion of the shuttle belt,
wherein the shuttle belt is engaged with the and the movement of the at least a portion of the shuttle belt causes a corresponding movement of the shuttle along the second direction.

10. The lithography apparatus of claim 1, further comprising:
a balance mass configured to:
receive reaction forces from the movement of the carrier; and
move in response to balance changes in momentum of the carrier during the movement of the carrier.

11. The lithography apparatus of claim 1, wherein:
the magnet and coil system is configured to provide an upward force to support a weight of the carrier during the transfer of the pattern onto the substrate.

12. The lithography apparatus of claim 1, wherein the magnet and coil system comprises:
a backiron comprising a high relative magnetic permeability, the high relative magnetic permeability being greater than 150.

13. The lithography apparatus of claim 1, wherein:
the carrier comprises an air mount configured to establish an elevated gas pressure beneath the carrier to support a weight of the carrier during the transfer of the pattern onto the substrate.

14. A drive system configured to move a carrier, the drive system comprising:
a magnet and coil system configured to:
apply a first force to the carrier, and
move the carrier along a first or second direction, the second direction being perpendicular to the first direction;
a shuttle configured to move the carrier along the second direction, the shuttle being located to one side of the carrier;
a shuttle driver configured to:
apply a second force to the carrier via the shuttle, the second force being applied to the carrier in addition to the first force, and
drive the shuttle along the second direction;
a shuttle connector configured to:
connect the shuttle to the carrier, and
allow movement of the carrier relative to the shuttle along the first direction; and
a shuttle connector driver configured to drive the shuttle connector.

15. The drive system of claim 14, wherein:
the shuttle connector driver is further configured to apply a third force to the carrier along the first direction, the third force being applied to the carrier in addition to the first force.

16. The drive system of claim 14 wherein:
the shuttle driver is configured to apply the second force along the second direction.

17. A device manufacturing method comprising:
driving, using a drive system, a carrier relative to a projection system in a horizontal plane, the driving comprising:
applying, using a magnet and coil system, a first force to the carrier;
moving, using the magnet and coil system, the carrier along a first or second direction, the second direction being perpendicular to the first direction;
driving, using a shuttle driver, a shuttle connected to the carrier along the second direction;
applying, using the shuttle driver, a second force to the carrier, the second force being applied substantially simultaneously with the first force to the carrier; and
moving, using a shuttle connector, the carrier relative to the shuttle along the first direction.

18. A method comprising:
driving, using a drive system, in a plane, the driving comprising:
applying, using a magnet and coil system, a first force to the carrier;
moving, using the magnet and coil system, the carrier along a first or second direction, the second direction being perpendicular to the first direction;
driving, using a shuttle driver, a shuttle connected to the carrier along the second direction;
applying, using the shuttle driver, a second force to the carrier, the second force being applied to the carrier in addition to the first force;
moving, using a shuttle connector, the carrier relative to the shuttle along the first direction; and
applying, using a shuttle connector driver, a third force to the carrier, the third force being applied to the carrier in addition to the first force.

19. The lithography apparatus of claim 1, wherein:
the magnet and coil system is configured to apply the first force along the first direction; and
the shuttle driver is configured to apply the second force along the second direction.

20. The lithography apparatus of claim 1, wherein:
the magnet and coil system is configured to apply the first force along the second direction; and
the shuttle connector comprises a shuttle connector driver configured to apply a third force to the carrier along the first direction, the third force being applied in addition to the first force.

21. The lithography apparatus of claim 1, wherein the magnet and coil system comprises:
a coil attached to a balance mass;
a permanent magnet attached to the carrier; and
a controller configured to drive the coil to apply the first force to the carrier.

* * * * *

UNITED STATES PATENT AND TRADEMARK OFFICE
CERTIFICATE OF CORRECTION

| | | |
|---|---|---|
| PATENT NO. | : 8,932,042 B2 | Page 1 of 1 |
| APPLICATION NO. | : 13/296571 | |
| DATED | : January 13, 2015 | |
| INVENTOR(S) | : Vermeulen et al. | |

It is certified that error appears in the above-identified patent and that said Letters Patent is hereby corrected as shown below:

In the Claims,

In column 20, line 66, claim 5, please delete "pivotal" and insert --pivotably--.

Signed and Sealed this
Eighth Day of September, 2015

Michelle K. Lee
*Director of the United States Patent and Trademark Office*